US010779429B2

(12) United States Patent
Clarke et al.

(10) Patent No.: US 10,779,429 B2
(45) Date of Patent: Sep. 15, 2020

(54) METHOD OF FORMING A FLAMEPROOF HOUSING

(71) Applicant: Micro Motion, Inc., Boulder, CO (US)

(72) Inventors: David Clarke, Lafayette, CO (US); Atul Vasant Deshpande, Pune (IN)

(73) Assignee: Micro Motion, Inc., Boulder, CO (US)

( * ) Notice: Subject to any disclaimer, the term of this patent is extended or adjusted under 35 U.S.C. 154(b) by 130 days.

(21) Appl. No.: 16/189,006

(22) Filed: Nov. 13, 2018

(65) Prior Publication Data
US 2019/0082549 A1 Mar. 14, 2019

Related U.S. Application Data

(62) Division of application No. 14/419,180, filed as application No. PCT/US2012/052632 on Aug. 28, 2012, now Pat. No. 10,225,942.

(51) Int. Cl.
*H05K 5/06* (2006.01)
*G01F 1/84* (2006.01)
(Continued)

(52) U.S. Cl.
CPC ............. *H05K 5/06* (2013.01); *G01F 1/8409* (2013.01); *G01F 1/8477* (2013.01);
(Continued)

(58) Field of Classification Search
CPC .. H05K 5/06; H05K 5/02; H05K 5/03; H05K 5/0017; H05K 5/0213; H05K 7/1462;
(Continued)

(56) References Cited

U.S. PATENT DOCUMENTS 6,153,720 A * 11/2000 Olzak .................... C08L 59/02
528/182
6,286,373 B1 9/2001 Lister et al.
(Continued)

FOREIGN PATENT DOCUMENTS

| EP | 1016892 A2 | 7/2000 |
|---|---|---|
| EP | 2105043 B1 | 2/2011 |

(Continued)

*Primary Examiner* — Sarang Afzali
(74) *Attorney, Agent, or Firm* — The Ollila Law Group LLC

(57) ABSTRACT

A method for forming a flameproof transmitter is disclosed. The transmitter includes a flameproof housing including an interior surface, a display aperture and a shoulder adjacent to the aperture at first end of the housing. A transparent panel including an outer face and a perimeter is inserted into the housing from a second end to threadingly engage a fastener feature located on the interior surface of the housing such that the fastener element contacts the transparent panel and retains the transparent panel against the shoulder. A perimeter interface region between the perimeter of the transparent panel and the interior surface of the flameproof housing creates a perimeter gap that does not exceed a predetermined flameproof gap limit and a face interface region between the outer face of the transparent panel and the shoulder creates a face gap that does not exceed the predetermined flameproof gap limit.

8 Claims, 7 Drawing Sheets

(51) Int. Cl.
*H05K 5/00* (2006.01)
*H05K 5/02* (2006.01)
*H05K 7/14* (2006.01)
*H05K 5/03* (2006.01)

(52) U.S. Cl.
CPC ............ *H05K 5/0017* (2013.01); *H05K 5/02* (2013.01); *H05K 5/0213* (2013.01); *H05K 5/03* (2013.01); *H05K 7/1462* (2013.01); *Y10T 29/49826* (2015.01); *Y10T 29/49963* (2015.01)

(58) Field of Classification Search
CPC .......... H05K 5/00; H05K 7/14; G01F 1/8477; G01F 1/8409; G01F 1/84; Y10T 29/49826; Y10T 29/49947; Y10T 29/49963
See application file for complete search history.

(56) References Cited

U.S. PATENT DOCUMENTS

| | | |
|---|---|---|
| 7,743,641 B2 | 6/2010 | Bailey et al. |
| 9,089,049 B2 * | 7/2015 | Perrault ............ G02F 1/133308 |
| 2012/0063065 A1 | 3/2012 | Perrault et al. |

FOREIGN PATENT DOCUMENTS

| | | |
|---|---|---|
| FR | 2651270 A1 | 3/1991 |
| JP | H05288577 A | 11/1993 |
| JP | 52034994 U1 | 7/2013 |
| WO | 8203260 A1 | 9/1982 |
| WO | 0123858 A1 | 4/2001 |
| WO | 2005062687 A | 7/2005 |

* cited by examiner

SECTION AA

SECTION AA

SECTION AA

METHOD OF FORMING A FLAMEPROOF HOUSING

CROSS-REFERENCE TO THE RELATED APPLICATIONS

This is a Divisional Application of application Ser. No. 14/419,180, with a filing date of Feb. 2, 2015, now U.S. Pat. No. 10,225,942, entitled 'FLAMEPROOF HOUSING WITH DISPLAY," which is a National Stage entry of International Application No. PCT/TJS2012/052632, with an international filing date of Aug. 28, 2012 entitled "FLAMEPROOF HOUSING WITH DISPLAY."

FIELD OF THE INVENTION

The present invention relates to a flameproof housing, and more particularly, to a flameproof housing with a display.

Statement of the Problem

Vibrating conduit sensors, such as Coriolis mass flowmeters and vibrating densitometers, typically operate by detecting motion of a vibrating conduit that contains a flowing material. Properties associated with the material in the conduit, such as mass flow, density and the like, can be determined by processing measurement signals received from motion transducers associated with the conduit. The vibration modes of the vibrating material-filled system generally are affected by the combined mass, stiffness and damping characteristics of the containing conduit and the material contained therein.

A typical Coriolis mass flowmeter includes one or more conduits that are connected inline in a pipeline or other transport system and convey material, e.g., fluids, slurries, emulsions, and the like, in the system. Each conduit may be viewed as having a set of natural vibration modes, including for example, simple bending, torsional, radial, and coupled modes. In a typical Coriolis mass flow measurement application, a conduit is excited in one or more vibration modes as a material flows through the conduit, and motion of the conduit is measured at points spaced along the conduit. Excitation is typically provided by an actuator, e.g., an electromechanical device, such as a voice coil-type driver, that perturbs the conduit in a periodic fashion. Mass flow rate may be determined by measuring time delay or phase differences between motions at the transducer locations. Two such transducers (or pickoff sensors) are typically employed in order to measure a vibrational response of the flow conduit or conduits, and are typically located at positions upstream and downstream of the actuator. The two pickoff sensors are connected to electronic instrumentation. The instrumentation receives signals from the two pickoff sensors and processes the signals in order to derive a mass flow rate measurement, among other things. Vibratory flowmeters, including Coriolis mass flowmeters and densitometers, therefore employ one or more flow tubes that are vibrated in order to measure a fluid.

In some environments, electrical signals may need to be conducted through a flameproof physical barrier or housing. For example, a housing may surround and enclose electrical circuits of a meter electronics or transmitter. Process control transmitters designed for use in hazardous atmospheres often utilize a combination of protection methods, including flameproof housings and/or barriers, to avoid uncontrolled explosions of flammable gases. International standards define the compliance requirements for flameproof devices and structures.

In the case of Coriolis flowmeter transmitters, it is well known to enclose the active electronics components within a flameproof compartment or housing so that an explosion of gases that might occur as a result of electrical energy within the electronics will not propagate beyond the enclosure. Consequently, the housing is desired to be sealed off, including display components that need to remain externally visible.

FIG. 1 shows a prior art flameproof display panel interface using a prior art curable sealing material. A potting material or adhesive is applied to one or both of the housing and/or the glass panel before assembly and comprises a curable sealing material. When the glass panel is moved into position in the housing, as shown, the potting material or adhesive is at least partially compressed between the glass panel and a portion of the housing. The potting material or adhesive therefore is desirably spread over essentially an entire interface region between the glass panel and the corresponding portion of the housing. The curable sealing material may then cure over time, or may be subject to heating or other processes to cure the material. The potting material or adhesive not only may seal the glass panel to the housing, but may also bond the two components together, thereby providing a cementing function.

The prior art has drawbacks. The potting material or adhesive may be subject to environmental and/or workplace regulations and may therefore be expensive and costly to handle, to apply, and to dispose of. The potting material or adhesive may not be allowed by regulation in some locales. The potting material or adhesive can be improperly or incompletely applied. After installation, the potting material or adhesive may include air bubbles, cracks, furrows, or irregular boundaries or may be too narrow to form a flame path of a desired length. The potting material or adhesive may shrink and/or crack with age, wherein the glass panel may exhibit leakage over time. The potting material or adhesive may lose adhesion to one or both of the glass panel and the housing.

What is needed, therefore, is a glass display panel that does not require cementing in order to achieve a flameproof seal with a corresponding housing.

ASPECTS OF THE INVENTION

In one aspect of the invention, a flameproof housing comprises:
 a display aperture formed in the flameproof housing;
 a shoulder adjacent to the display aperture;
 a transparent panel including an outer face and a perimeter; and
 a fastener element configured to engage an interior surface of the flameproof housing and hold the transparent panel against the shoulder;
 wherein a perimeter interface region between the perimeter of the transparent panel and the interior surface of the flameproof housing creates a perimeter gap that does not exceed a predetermined flameproof gap limit and wherein a face interface region between the outer face of the transparent panel and the shoulder creates a face gap that does not exceed the predetermined flameproof gap limit.

Preferably, the flameproof housing further comprises a seal groove formed in the shoulder and a seal positioned in the seal groove, wherein the seal prevents moisture from entering the flameproof housing at the display aperture.

Preferably, the shoulder includes a predetermined shoulder width that defines the face interface region.

Preferably, the transparent panel includes a predetermined panel thickness that defines the perimeter interface region.

Preferably, a flamepath length comprises a predetermined panel thickness plus a predetermined shoulder width.

Preferably, the perimeter interface region provides a first flamepath span $L_1$ and the face interface region provides a second flamepath span $L_2$, wherein the first flamepath span $L_1$ plus the second flamepath span $L_2$ provides a flamepath length that equals or exceeds a predetermined minimum flamepath length.

Preferably, the perimeter interface region provides a first flamepath span $L_1$ and the face interface region provides a second flamepath span $L_2$, wherein the first flamepath span $L_1$ plus the second flamepath span $L_2$ provides a flamepath length that equals or exceeds a predetermined minimum flamepath length, wherein the second flamepath span $L_2$ comprises a shoulder width of the shoulder minus a seal groove width of the seal groove.

Preferably, the perimeter interface region provides a first flamepath span $L_1$ and the face interface region provides a second flamepath span wherein the first flamepath span $L_1$ plus the second flamepath span $L_2$ provides a flamepath length that equals or exceeds a predetermined minimum flamepath length, wherein the second flamepath span $L_2$ comprises an outer shoulder portion that is located outward from the seal groove.

In one aspect of the invention, a method of forming a flameproof housing comprises:
  providing a display aperture in the flameproof housing;
  providing a shoulder adjacent to the display aperture;
  providing a transparent panel including an outer face and a perimeter; and
  providing a fastener element configured to engage an interior surface of the flameproof housing and hold the transparent panel against the shoulder;
  wherein a perimeter interface region between the perimeter of the transparent panel and the interior surface of the flameproof housing creates a perimeter gap that does not exceed a predetermined flameproof gap limit and wherein a face interface region between the outer face of the transparent panel and the shoulder creates a face gap that does not exceed the predetermined flameproof gap limit.

Preferably, the method further comprises providing a seal groove formed in the shoulder and providing a seal positioned in the seal groove, wherein the seal prevents moisture from entering the flameproof housing at the display aperture.

Preferably, the shoulder includes a predetermined shoulder width that defines the face interface region.

Preferably, the transparent panel includes a predetermined panel thickness that defines the perimeter interface region.

Preferably, a flamepath length comprises a predetermined panel thickness plus a predetermined shoulder width.

Preferably, the perimeter interface region provides a first flamepath span $L_1$ and the face interface region provides a second flamepath span $L_2$, wherein the first flamepath span $L_1$ plus the second flamepath span $L_2$ provides a flamepath length that equals or exceeds a predetermined minimum flamepath length.

Preferably, the perimeter interface region provides a first flamepath span $L_1$ and the face interface region provides a second flamepath span $L_2$, wherein the first flamepath span $L_1$ plus the second flamepath span $L_2$ provides a flamepath length that equals or exceeds a predetermined minimum flamepath length, wherein the second flamepath span $L_2$ comprises a shoulder width of the shoulder minus a seal groove width of the seal groove.

Preferably, the perimeter interface region provides a first flamepath span $L_1$ and the face interface region provides a second flamepath span $L_2$, wherein the first flamepath span $L_1$ plus the second flamepath span $L_2$ provides a flamepath length that equals or exceeds a predetermined minimum flamepath length, wherein the second flamepath span $L_2$ comprises an outer shoulder portion that is located outward from the seal groove.

DESCRIPTION OF THE DRAWINGS

The same reference number represents the same element on all drawings. The drawings are not necessarily to scale.

DETAILED DESCRIPTION OF THE INVENTION

FIGS. 2-7 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Figure 1:
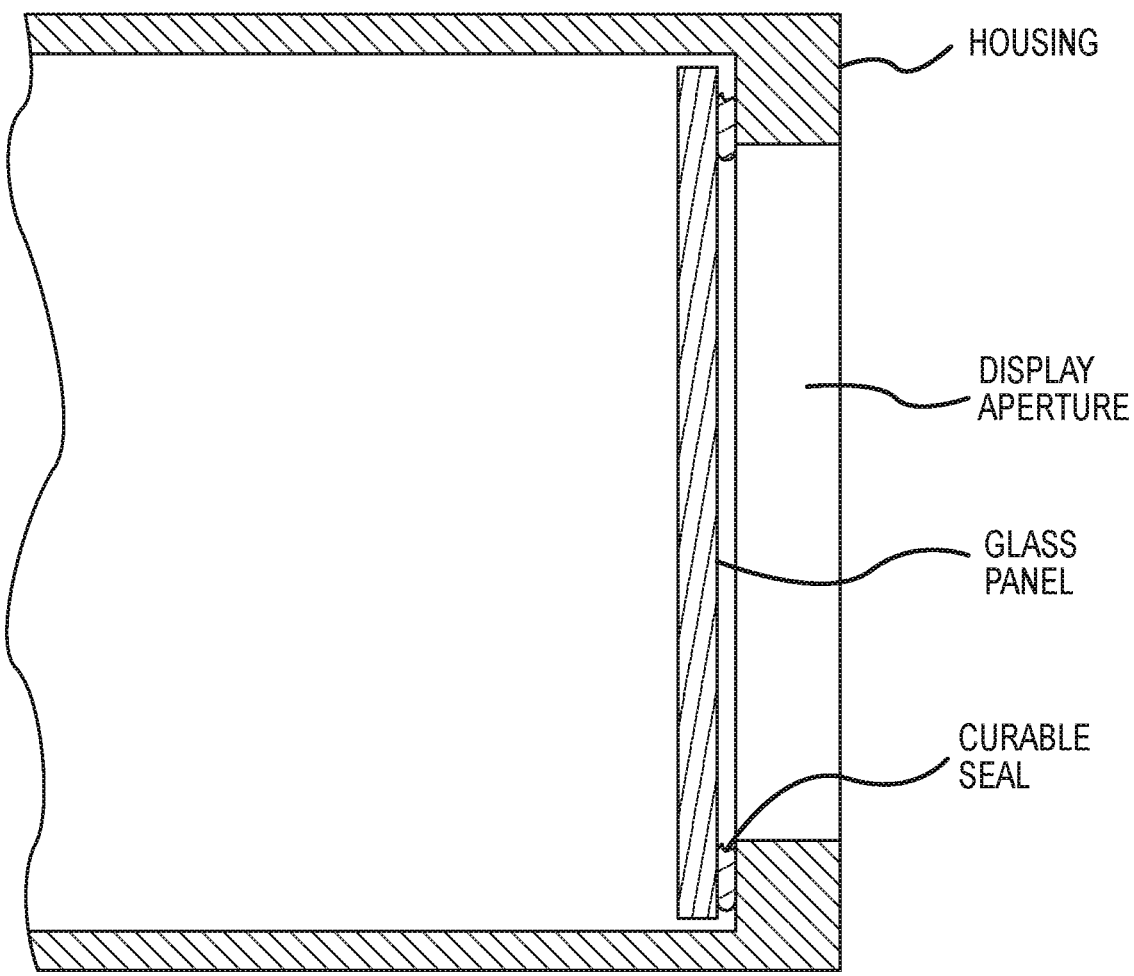
FIG. 1 shows a prior art flameproof display panel interface using a prior art curable sealing material.
Figure 2:
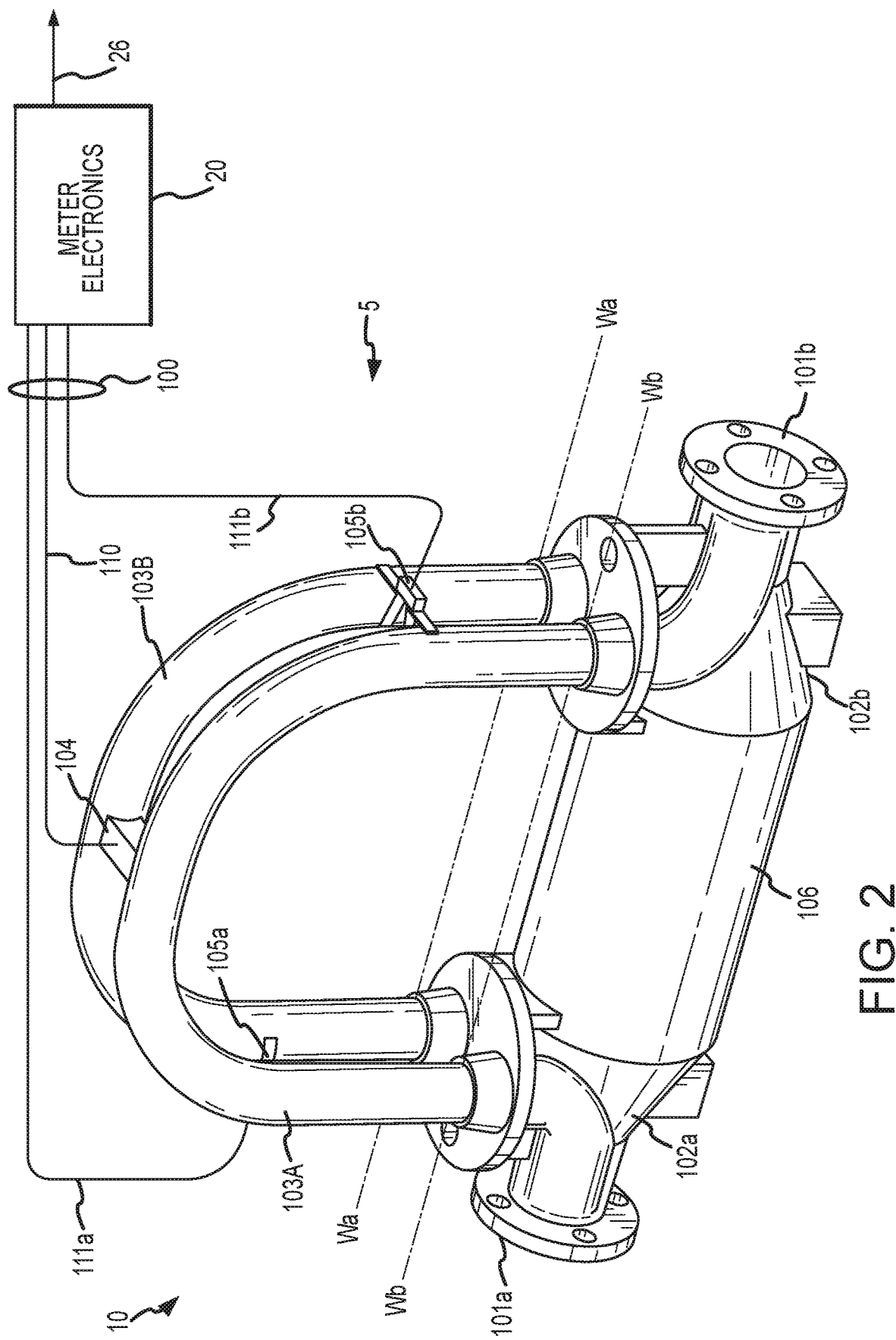
FIG. 2 shows a vibratory flowmeter according to the invention.

FIG. 2 shows a vibratory flowmeter 5 according to the invention. The vibratory flowmeter 5 comprises a flowmeter assembly 10 and meter electronics 20. The meter electronics 20 is connected to the meter assembly 10 via leads 100 and is configured to provide measurements of one or more of a density, mass flow rate, volume flow rate, totalized mass flow, temperature, or other measurements or information over a communication path 26. It should be apparent to those skilled in the art that the vibratory flowmeter 5 can comprise any manner of vibratory flowmeter, regardless of the number of drivers, pick-off sensors, flow conduits, or the operating mode of vibration. In some embodiments, the vibratory flowmeter 5 can comprise a Coriolis mass flowmeter. In addition, it should be recognized that the vibratory flowmeter 5 can alternatively comprise a vibratory densitometer.

The flowmeter assembly 10 includes a pair of flanges 101a and 101b, manifolds 102a and 102b, a driver 104, pick-off sensors 105a and 105b, and flow conduits 103A and 103B. The driver 104 and the pick-off sensors 105a and 105b are connected to the flow conduits 103A and 103B.

The flanges 101a and 101b are affixed to the manifolds 102a and 102b. The manifolds 102a and 102b can be affixed to opposite ends of a spacer 106 in some embodiments. The spacer 106 maintains the spacing between the manifolds 102a and 102b in order to prevent pipeline forces from being transmitted to flow conduits 103A and 103B. When the flowmeter assembly 10 is inserted into a pipeline (not shown) which carries the flow fluid being measured, the flow fluid enters the flowmeter assembly 10 through the flange 101a, passes through the inlet manifold 102a where the total amount of flow fluid is directed to enter the flow conduits 103A and 103B, flows through the flow conduits 103A and 103B and back into the outlet manifold 102b, where it exits the meter assembly 10 through the flange 101b.

The flow fluid can comprise a liquid. The flow fluid can comprise a gas. The flow fluid can comprise a multi-phase fluid, such as a liquid including entrained gases and/or entrained solids.

The flow conduits 103A and 103B are selected and appropriately mounted to the inlet manifold 102a and to the outlet manifold 102b so as to have substantially the same mass distribution, moments of inertia, and elastic modules about the bending axes Wa-Wa and Wb-Wb respectively. The flow conduits 103A and 103B extend outwardly from the manifolds 102a and 102b in an essentially parallel fashion.

The flow conduits 103A and 103B are driven by the driver 104 in opposite directions about the respective bending axes Wa and Wb and at what is termed the first out of phase bending mode of the vibratory flowmeter 5. The driver 104 may comprise one of many well known arrangements, such as a magnet mounted to the flow conduit 103A and an opposing coil mounted to flow conduit 103B. An alternating current is passed through the opposing coil to cause both conduits to oscillate. A suitable drive signal is applied by the meter electronics 20 to the driver 104 via the lead 110. Other driver devices are contemplated and are within the scope of the description and claims.

The meter electronics 20 receives sensor signals on the leads 111a and 111b, respectively. The meter electronics 20 produces a drive signal on the lead 110 which causes the driver 104 to oscillate the flow conduits 103A and 103B. Other sensor devices are contemplated and are within the scope of the description and claims.

The meter electronics 20 processes the left and right velocity signals from the pick-off sensors 105a and 105b in order to compute a flow rate, among other things. The communication path 26 provides an input and an output means that allows the meter electronics 20 to interface with an operator or with other electronic systems. The description of FIG. 2 is provided merely as an example of the operation of a Coriolis flowmeter and is not intended to limit the teaching of the present invention.

The meter electronics 20 in one embodiment is configured to vibrate the flow conduits 103A and 103B. The vibration is performed by the driver 104. The meter electronics 20 further receives resulting vibrational signals from the pickoff sensors 105a and 105b, The vibrational signals comprise vibrational responses of the flow conduits 103A and 103B. The meter electronics 20 processes the vibrational responses and determines a response frequency and/or phase difference. The meter electronics 20 processes the vibrational response and determines one or more flow measurements, including a mass flow rate and/or density of the flow fluid. Other vibrational response characteristics and/or flow measurements are contemplated and are within the scope of the description and claims.

In one embodiment, the flow conduits 103A and 103B comprise substantially U-shaped flow conduits, as shown. Alternatively, in other embodiments, the flow conduits can comprise substantially straight flow conduits or can comprise one or more flow conduits of curved shapes other than U-shaped flow conduits. Additional flowmeter shapes and/or configurations can be used and are within the scope of the description and claims.

Figure 3:
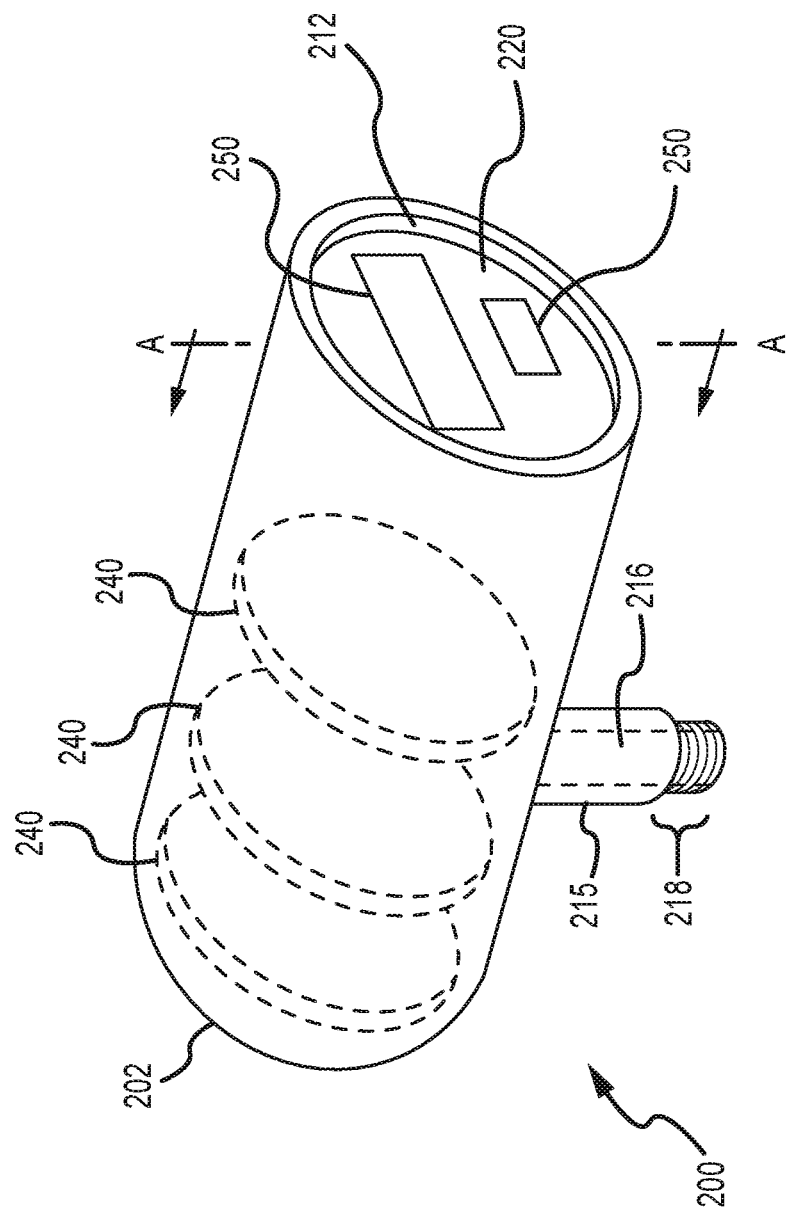
FIG. 3 shows a transmitter including a flameproof housing according to an embodiment of the invention.

FIG. 3 shows a transmitter 200 including a flameproof housing 202 according to an embodiment of the invention. The flameproof transmitter 200 includes the flameproof housing 202 wherein the flameproof housing 202 can hold one or more transmitter components 240 (see dashed lines). The flameproof transmitter 200 may hold and include the meter electronics 20, among other things. The one or more transmitter components 240 may comprise circuit boards, but may also comprise other devices or systems. In some embodiments, the flameproof transmitter 200 may include communication electronics for a vibratory flowmeter or flowmeters 5. The flameproof transmitter 200 may include operation and control electronics for a vibratory flowmeter or flowmeters 5. The flameproof transmitter 200 may include power electronics for a vibratory flowmeter or flowmeters 5.

Figure 4:
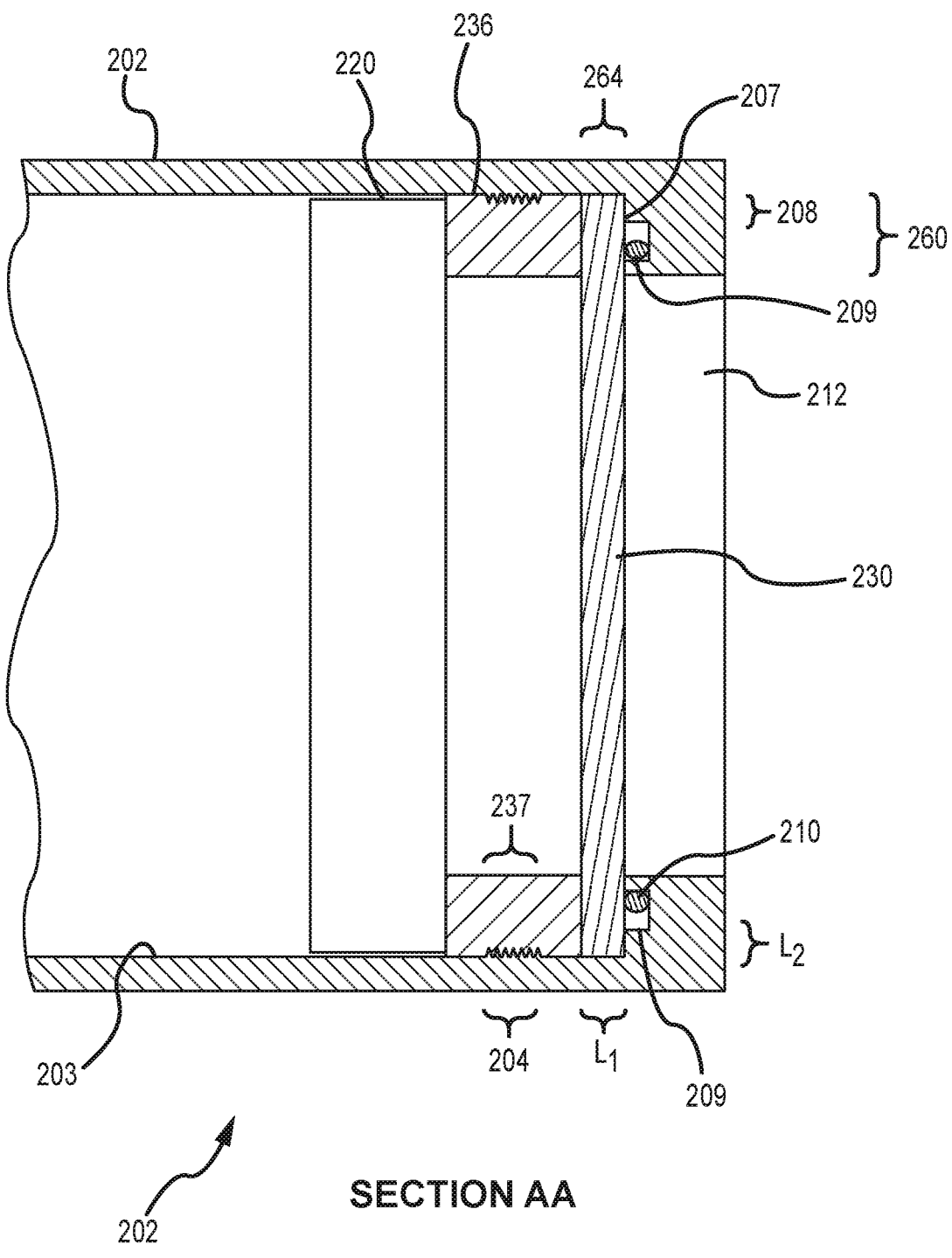
FIG. 4 is a cross-sectional view AA of the flameproof housing of the transmitter according to an embodiment of the invention.

The flameproof transmitter 200 mainly comprises a flameproof housing 202 that is substantially hollow see FIG. 4). The flameproof housing 202 may be formed of any desired material, including metals, but may be formed of other materials if desired. Although the flameproof housing 202 is shown as being substantially cylindrical, it should be understood that the flameproof housing 202 is not limited to any particular shape or size. The flameproof housing 202 is configured to be substantially sealed and is configured to prevent ignition or flame to pass either into or out of the flameproof housing 202.

The flameproof housing 202 includes a display aperture 212. The display aperture 212 may be substantially circular, as shown, or may comprise other shapes. The display aperture 212 may be of any desired size and may take up any desired amount of the exterior surface area of the flameproof housing 202. A display panel 220 may be at least partially visible through the display aperture 212. The display panel 220 may include one or more display elements 250, including electronic displays, light-generating and/or light manipulating displays, mechanical displays, or electromechanical displays.

However, the display panel 220 is not open to the exterior of the flameproof housing 202. The flameproof housing 202 includes a transparent panel 230 that substantially seals the display aperture 212 (see FIG. 4). The transparent panel 230 may comprise any suitable transparent material, such as glass or tempered glass in some embodiments.

The flameproof housing 202 may be designed to conform to applicable flameproof standards, wherein a flame is not permitted to pass out of or into the flameproof housing 202. The flameproof transmitter 200 may further include any manner of isolation electronics and/or physical barriers for preventing a flame or ignition to enter or leave the flameproof transmitter 200, such as where the flameproof transmitter 200 is located in a hazardous or explosive environment.

The interface between the transparent panel 230 and the flameproof housing 202 may comprise a spigot joint. A spigot joint is generally characterized by tightly toleranced mating parts that prevent flame propagation through rapid energy dissipation of a flame.

Spigot joints have not been used in the prior art for glass panels, due to the need for extremely tight tolerances. A spigot joint is employed herein through the achievement of glass processing techniques that can achieve tolerances on the order of thousandths of an inch in some embodiments.

The flameproof housing 202 may include a stand-off 215 that extends from the flameproof housing 202. More than one stand-off 215 may be included in the flameproof housing 202 in some embodiments. The stand-off 215 includes a stand-off passage 216, wherein wires, cables, optical fibers, or other communication links may enter and exit the flameproof housing 202 through the stand-off passage 216. The stand-off 215 may further include a coupling section 218, such as threading, wherein the coupling section 218 may removably attach the flameproof housing 202 (and therefore the transmitter 200) to another device or structure, such as a vibratory flowmeter 5 or associated structure. However, other coupling features are contemplated and are within the scope of the description and claims.

FIG. 4 is a cross-sectional view AA of the flameproof housing 202 of the transmitter 200 according to an embodiment of the invention. It can be seen from this figure that the housing 202 comprises a substantially hollow chamber defined by an interior surface 203. It can also be seen that the display aperture 212 passes through the wall of the housing 202. It should be understood that the housing 202 may include more than one display aperture 212. It should be understood that the display aperture 212 may be located on other positions on the flameproof housing 202.

In the embodiment shown, the housing 202 may be substantially cylindrical and the display aperture 212 may be substantially circular. However, it should be understood that the housing 202 and the display aperture 212 may be of any desired shape and size.

The housing 202 in the embodiment shown includes a shoulder 207. If the housing 202 is substantially cylindrical, then the shoulder 207 may be substantially annular in some embodiments. The shoulder 207 may be machined or otherwise formed to be substantially smooth and flat, and may be formed to meet a predetermined surface tolerance. The predetermined surface tolerance may include a surface planarity tolerance in some embodiments. The predetermined surface tolerance may include a surface roughness tolerance in some embodiments.

A seal groove 209 may be formed in the shoulder 207. A seal 210 may be received in the seal groove 209. The seal 210 is provided to keep moisture and other contaminants from entering the housing 202 at the display aperture 212. In some embodiments, such as where the seal groove 209 is substantially annular, the seal 210 may comprise an O-ring 210. The seal 210 may be substantially resilient in some embodiments.

The seal or seals may comprise a solid seal or seals, such as O-rings, gaskets, or other components that may be clamped between the components. Alternatively, the seal or seals may comprise a liquid, paste, grease, or other material that does not have a predetermined shape and that can be applied to one or more of the components of the flameproof feed-through 200. The seal or seals may comprise a material that does not substantially change. Alternatively, the seal or seals may comprise a material that hardens, cures, or otherwise transforms or is transformed during or after the assembly process.

The transparent panel 230 may be assembled to the shoulder 207, with an outer face 231 of the transparent panel 230 (see FIG. 5) contacting the shoulder 207. The outer face 231 of the transparent panel 230 may also contact the resilient seal 210.

In some assembly method embodiments, the transparent panel 230 is assembled to the flameproof housing 202 in order to form a spigot-type joint. One or more of the outer face 231 and the perimeter 232 of the transparent panel 230 are polished, planed, milled, ground, etched, turned, or otherwise processed to where one or both of the perimeter interface region 264 and the face interface region 260 do not exceed a predetermined flameproof gap limit. Similarly, one or more of the shoulder 207 and the interior surface 203 of the flameproof housing 202 are polished, planed, milled, ground, etched, turned, or otherwise processed to where the flameproof housing 202 achieves a predetermined gap with the transparent panel 230. In other words, the transparent panel 230 and the flameproof housing 202 are polished or otherwise processed to achieve a gap height that is less than the predetermined flameproof gap limit.

The outer face 231 of the transparent panel 230 may be formed to meet a predetermined surface tolerance. Although only one face of the transparent panel 230 is labeled as the outer face 231, it should be understood that both sides of the transparent panel 230 may be polished or processed to the predetermined surface tolerance and may face outward from inside the housing 202. The predetermined surface tolerance may include a predetermined surface planarity tolerance in some embodiments. The predetermined surface tolerance may include a predetermined surface roughness tolerance in some embodiments.

A perimeter 232 of the transparent panel 230 may contact the interior surface 203 of the housing 202. The perimeter 232 of the transparent panel 230 may be formed to meet a predetermined size tolerance. The predetermined size tolerance may include a predetermined dimensional tolerance in some embodiments. For example, where the perimeter 232 is substantially circular, the perimeter 232 may meet a predetermined diameter tolerance, wherein a gap height of a gap between the interior surface 203 of the housing 202 and the perimeter 232 is less than a predetermined flameproof gap limit. The predetermined size tolerance may include a predetermined surface roughness tolerance in some embodiments.

When assembled, the transparent panel 230 is placed inside the housing 202 and the outer face 231 of the transparent panel 230 is brought substantially into contact with the shoulder 207. The outer face 231 comprises a surface that has been formed to meet the predetermined surface tolerance.

The shoulder 207 in some embodiments defines a face interface region 260. The face interface region 260 comprises a region where the outer face 231 of the transparent panel 230 is brought substantially into contact with the surface of the shoulder 207. The face interface region 260 comprises a substantially planar interface. The size, shape, and area of the face interface region 260 are defined by the size and geometry of the shoulder 207. Because the shoulder 207 and the outer face 231 are formed to exacting tolerances, the face interface region 260 will provide a close fit, with a gap height of a gap between the shoulder 207 and the outer face 231 being less than a predetermined flameproof gap limit. This may be achieved where a gap height tolerance for the outer face 231 and for the shoulder 207 are each about one-half of the predetermined flameproof gap limit.

The face interface region 260 forms a second flamepath span $L_2$. Some or all of the face interface region 260 may comprise the second flamepath span $L_2$. The second flamepath span $L_2$ in some embodiments comprises a shoulder width of the shoulder 207. The second flamepath span $L_2$ in some embodiments comprises a shoulder width of the shoulder 207 minus a seal groove width of the seal groove 209. Alternatively, in other embodiments the second flamepath span $L_2$ comprises a shoulder portion 208 that is located outward from the seal groove 209.

The assembly of the transparent panel 230 to the shoulder 207 will also create a perimeter interface region 264. The perimeter interface region 264 comprises a region where the perimeter 232 of the transparent panel 230 is adjacent to the interior surface 203 of the housing 202. The perimeter interface region 264 may comprise a first flamepath length $L_1$. The size, shape, and area of the perimeter interface region 264 are defined by the size and geometry of the perimeter 232 of the transparent panel 230. Because the perimeter 232 of the transparent panel 230 is formed to exacting tolerances, the perimeter interface region 264 will provide a close fit to the interior surface 203 of the housing 202, with a gap height of a gap between the interior surface 203 and the perimeter 232 being less than a predetermined flameproof gap limit. This may be achieved where a gap height tolerance for the transparent panel 230 and a gap height tolerance for the shoulder 207 and the interior surface 203 are each about one-half of the predetermined flameproof gap limit.

It is desired that gaps do not exist between the transparent panel 230 and the flameproof housing 202, or at least are less than the predetermined flameproof gap limit. Gaps may allow gasses to leak through and therefore may allow possible ignition of the gas or gasses. Gaps may allow ignition products to propagate around the transparent panel 230 and escape from the flameproof housing 202. Consequently, the transparent panel 230, the interior surface 203, and the shoulder 207 are substantially smooth and regular, i.e., to within a predetermined surface finish.

The first flamepath span $L_1$ and the second flamepath span $L_2$, when combined, provide a resulting or total flamepath length ($L_1+L_2$). The flamepath length is configured to exceed a predetermined minimum flame path length. The flamepath length may be designed to exceed a predetermined minimum flame path length given by an applicable flameproof standard. By exceeding the predetermined minimum flamepath length, the flamepath length ($L_1+L_2$) ensures that a flame cannot successfully pass around the transparent panel 230. The flamepath length may be selected so that a flame may not propagate from one side of the transparent panel 230 to the other side with sufficient heat or energy content to cause ignition, given a gap between the transparent panel 230 and the interior surface 203 of the flameproof housing 202. Consequently, a flame within the housing 202 cannot escape to the exterior, and a flame outside the housing 202 cannot travel to the interior of the housing 202.

A flame path between the transparent panel 230 and the interior surface 203 of the flameproof housing 202 can be defined as having both a gap height and a flame path length. Compliance with a flame proof standard may require maintaining a small gap height, a long flame path length, or both.

The flamepath length is by definition the length of a gap or interface that a flame will be required to travel in order to pass through the interface. Flameproof standards typically define a minimum flamepath length required in order to achieve a flameproof characteristic. The minimum flamepath length is defined so that a flame that passes through the interface will dissipate before successfully passing all the way through the interface.

In some embodiments of the flameproof housing 202, the flamepath length comprises a transparent panel thickness plus a shoulder width. In some embodiments of the flameproof housing 202, the flamepath length comprises the first flamepath span $L_1$, plus the second flamepath span $L_2$. In some embodiments of the flameproof housing 202, the flamepath length comprises the first flamepath span $L_1$ plus the second flamepath span $L_2$, wherein the second flamepath span $L_2$ comprises a shoulder width minus a seal groove width. In some embodiments of the flameproof housing 202, the flamepath length comprises the first flamepath span $L_1$ plus the second flamepath span $L_2$, wherein the second flamepath span $L_2$ comprises a shoulder width of a shoulder portion 208 that is located outward from the seal groove 209.

In some embodiments, the flameproof housing 202 may be designed to conform to the section 5.2.4.3 of TEC 60079-1:2007, which permits a spigot joint wherein a cross-sectional gap height can be a maximum of about 0.0059 inch (five point nine thousandths of an inch) or a maximum of about 0.15 millimeter ("Electrical apparatus for explosive gas atmospheres—Part 1: Flame proof enclosures 'd'," issued by Commission Electrotechnique Internationale as IEC 60079-1:2007). For example, the outer face 231 may be processed so that the surface does not have variations greater than about 0.00295 inch in height. Where both the outer face 231 and the shoulder 207 do not have variations greater than about 0.00295 inch, then when mated, the gap between the two components cannot be greater than about 0.0059 inch in cross-sectional height.

After the transparent panel 230 is in position, the transparent panel 230 may be held in position by a fastener element 236, for example. The fastener element 236 may clamp or otherwise hold the transparent panel 230 against the shoulder 207. Consequently, the fastener element 236 may ensure that the gap between the transparent panel 230 and the shoulder 207 (i.e., the face interface region 260) does not exceed the predetermined flameproof gap limit. The fastener element 236 may ensure that the transparent panel 230 cannot move away from the shoulder 207.

The fastener element 236 may include a perimeter fastener feature 237 that corresponds to an internal housing fastener feature 204 on the interior surface 203 of the housing 202. In some embodiments, the fastener features 204 and 237 comprise threading, wherein the fastener element 236 may be rotated to bring the fastener element 236 into retaining contact with the transparent panel 230.

In another embodiment, the fastener element 236 may comprise a wave washer in combination with a snap ring. The wave washer is positioned between the snap ring and the transparent panel 230. The snap ring is configured to be fixed in position in a predetermined location on the interior surface 203. For example, the snap ring may engage a groove, ridge, or other projection or depression, or multiple such features, on the interior surface 203. The wave washer comprises an undulating washer that has regions displaced away from a central plane of the washer and is formed of a resilient, springy material. As a result, the wave washer will generate an expansion force when compressed. When the wave washer is at least partially compressed between the snap ring and the transparent panel 230, the wave washer will place a force on the transparent panel 230 (or other intervening component). The force presses the transparent panel 230 against the shoulder 207. However, it should be understood that the fastener features 204 and 237 may comprise any suitable fastener features.

The display panel 220 may be located after the fastener element 236, as shown, wherein the display panel 220 may be visible through the fastener element 236, the display aperture 212, and the transparent panel 230. It should be understood that the fastener element 236 is shown with an exaggerated depth, but may be smaller relative to the transparent panel 230 and/or the display panel 220.

In an alternative embodiment, the display panel 220 can fit into the fastener element 236. The display panel 220 may extend at least partially into the region inside the fastener element 236. Alternatively, the display panel 220 may extend at least partially into the region inside the fastener element 236 and may be affixed to the fastener element 236. Fasteners (not shown) may affix the display panel 220 to the fastener element 236. In another alternative, the display panel 220 and the fastener element 236 may be combined into a single component, wherein the fastener element 236 may comprise a portion of the display panel 220 and the display panel 220 therefore engages the internal housing fastener feature 204. In yet another alternative, the display panel 220 can be brought into contact with the transparent panel 230 and the fastener element 236 may be assembled to contact the display panel 220, wherein the display panel presses the transparent panel 230 against the shoulder 207.

Figure 5:
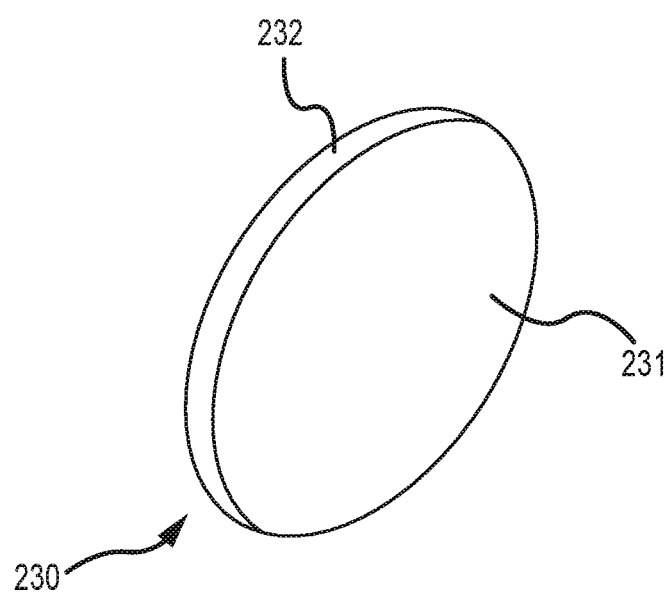
FIG. 5 shows a transparent panel for closing off a display aperture of the flameproof housing according to an embodiment of the invention.

FIG. 5 shows the transparent panel 230 for closing off the display aperture 212 of the flameproof housing 202 according to an embodiment of the invention. The transparent panel 230 may be substantially planar. The transparent panel 230 may be of a desired shape and thickness.

In some embodiments, the transparent panel 230 comprises glass. In some embodiments, the transparent panel 230 comprises tempered glass. Alternatively, the transparent panel 230 in other embodiments comprises plexiglas or other clear or transparent plastic materials. It should be understood that other transparent materials are contemplated for the transparent panel 230 and are within the scope of the description and claims.

Figure 6:
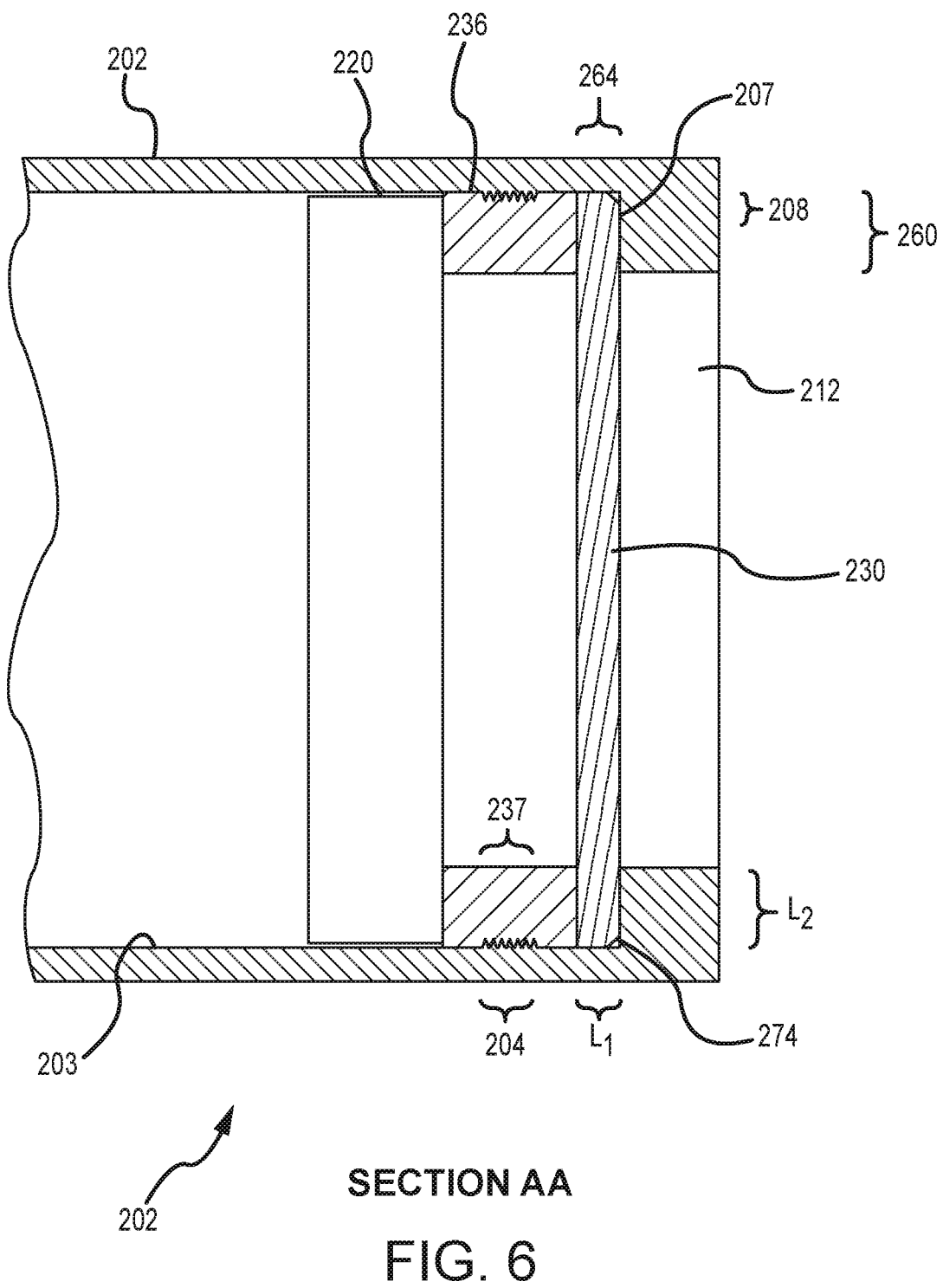
FIG. 6 is a cross-sectional view AA of the flameproof housing of the transmitter according to an embodiment of the invention.

FIG. 6 is a cross-sectional view AA of the flameproof housing 200 according to an embodiment of the invention. In this embodiment, the shoulder 207 does not include the seal groove 209 or the seal 210. As a consequence, the entire shoulder width can comprise the second flamepath span $L_2$, as depicted in the figure.

In addition, the transparent panel 230 may include a chamfered or beveled edge 274. The beveled edge 274 may comprise a bevel of any size or angle. The beveled edge 274 may enable easier assembly of the transparent panel 230 to the shoulder 207. It should be understood that the beveled edge 274 is an optional element and may be included in any embodiment of the flameproof housing 202.

Figure 7:
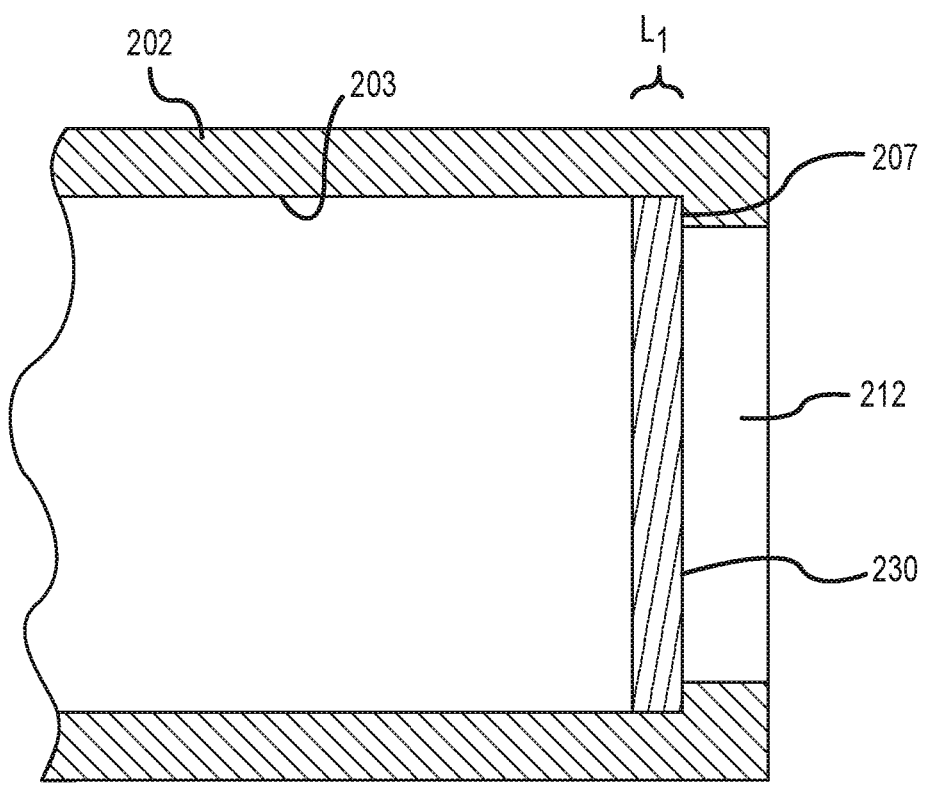
FIG. 7 is a cross-sectional view AA of the flameproof housing according to an embodiment of the invention.

FIG. 7 is a cross-sectional view AA of the flameproof housing 200 according to an embodiment of the invention. In this embodiment, the shoulder 207 is minimal in width and does not contribute significantly to the flamepath length. The shoulder 207 serves merely to provide a holding surface for positioning the transparent panel 230. As a consequence, the perimeter 232 of the transparent panel 230 comprises the first flamepath span $L_1$ and comprises essentially the total flamepath length, as depicted in the figure.

The flameproof housing according to any of the embodiments may provide advantages. The flameproof housing provides a transparent panel interface without the need for handling or using a curable seal material. The flameproof housing provides a transparent panel interface that does not require a step of applying a curable seal material. The flameproof housing provides a transparent panel interface that is flameproof through achievement of very close tolerances. The flameproof housing provides a transparent panel interface that does not rely on the bonding of a curable seal material to both a transparent panel and a housing.

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part to create additional embodiments within the scope and teachings of the invention. Accordingly, the scope of the invention should be determined from the following claims.

What is claimed is:

1. A method of forming a flameproof transmitter, the method comprising:
   providing a flameproof housing including an interior surface, a display aperture and a shoulder adjacent to the display aperture at a first end of the housing;
   positioning a transparent panel including an outer face and a perimeter inside the housing;
   positioning a fastener element into the housing;
   threadingly engaging the fastener element with an internal housing fastener feature located on the interior surface of the housing such that the fastener element contacts the transparent panel and retains the transparent panel against the shoulder;
   wherein a perimeter interface region between the perimeter of the transparent panel and the interior surface of the flameproof housing creates a perimeter gap, inclusive of the internal housing fastener feature, that does not exceed a predetermined flameproof gap limit and wherein a face interface region between the outer face of the transparent panel and the shoulder creates a face gap that does not exceed the predetermined flameproof gap limit.

2. The method of claim 1, further comprising:
   forming a seal groove in the shoulder; and positioning a seal in the seal groove, wherein the seal prevents moisture from entering the flameproof housing at the display aperture.

3. The method of claim 2, with the perimeter interface region providing a first flamepath span $L_1$ and with the face interface region providing a second flamepath span $L_2$, wherein the first flamepath span $L_1$ plus the second flamepath span $L_2$ provides a flamepath length that equals or exceeds a predetermined minimum flamepath length, wherein the second flamepath span $L_2$ comprises a shoulder width of the shoulder minus a seal groove width of the seal groove.

4. The method of claim 2, with the perimeter interface region providing a first flamepath span $L_1$ and with the face interface region providing a second flamepath span $L_2$, wherein the first flamepath span $L_1$ plus the second flamepath span $L_2$ provides a flamepath length that equals or exceeds a predetermined minimum flamepath length, wherein the second flamepath span $L_2$ comprises an outer shoulder portion that is located outward from the seal groove.

5. The method of claim 1, with the shoulder including a predetermined shoulder width that defines the face interface region.

6. The method of claim 1, with the transparent panel including a predetermined panel thickness that defines the perimeter interface region.

7. The method of claim 1, with a flamepath length comprising a predetermined panel thickness plus a predetermined shoulder width.

8. The method of claim 1, with the perimeter interface region providing a first flamepath span $L_1$ and with the face interface region providing a second flamepath span $L_2$, wherein the first flamepath span $L_1$ plus the second flamepath span $L_2$ provides a flamepath length that equals or exceeds a predetermined minimum flamepath length.

* * * * *

UNITED STATES PATENT AND TRADEMARK OFFICE
CERTIFICATE OF CORRECTION

PATENT NO. : 10,779,429 B2  
APPLICATION NO. : 16/189006  
DATED : September 15, 2020  
INVENTOR(S) : David Clarke and Atul Vasant Deshpande Page 1 of 1

It is certified that error appears in the above-identified patent and that said Letters Patent is hereby corrected as shown below:

In the Specification

Column 3, Line 25, replace "second flamepath span wherein" with -- second flamepath span $L_2$, wherein --.

Column 10, Line 16, replace "section 5.2.4.3 of TEC" with -- section 5.2.4.3 of IEC --.

Signed and Sealed this  
Twenty-fourth Day of November, 2020

Andrei Iancu  
*Director of the United States Patent and Trademark Office*